US010371571B2

(12) United States Patent
Baek et al.

(10) Patent No.: US 10,371,571 B2
(45) Date of Patent: Aug. 6, 2019

(54) THIN FILM STRUCTURE FOR MICRO-BOLOMETER AND METHOD FOR FABRICATING THE SAME

(71) Applicants: KOREA INSTITUTE OF SCIENCE AND TECHNOLOGY, Seoul (KR); UNIST(ULSAN NATIONAL INSTITUTE OF SCIENCE AND TECHNOLOGY), Ulsan (KR)

(72) Inventors: Seung Hyub Baek, Seoul (KR); Tae Hyeon Kil, Seoul (KR); Sanghyeon Kim, Seoul (KR); Won Jun Choi, Seoul (KR); Jeong Min Baik, Ulsan (KR); Ki-Suk Lee, Ulsan (KR)

(73) Assignees: Korea Institute of Science and Technology, Seoul (KR); UNIST (Ulsan National Institute of Science and Technology), Ulsan (KR)

( * ) Notice: Subject to any disclaimer, the term of this patent is extended or adjusted under 35 U.S.C. 154(b) by 0 days.

(21) Appl. No.: 15/926,366

(22) Filed: Mar. 20, 2018

(65) Prior Publication Data
US 2018/0335341 A1    Nov. 22, 2018

(30) Foreign Application Priority Data

May 19, 2017    (KR) .................. 10-2017-0062411

(51) Int. Cl.
*G01J 1/42*    (2006.01)
*G01J 5/02*    (2006.01)
(Continued)

(52) U.S. Cl.
CPC ................ *G01J 1/42* (2013.01); *G01J 5/024* (2013.01); *G01J 5/046* (2013.01); *G01J 5/20* (2013.01); *H01L 21/02172* (2013.01)

(58) Field of Classification Search
None
See application file for complete search history.

(56) References Cited

U.S. PATENT DOCUMENTS

| | | |
|---|---|---|
| 5,966,590 A | 10/1999 | Wada et al. |
| 8,502,639 B1 | 8/2013 | Coffey et al. |
| 2002/0139776 A1 | 10/2002 | Tsuchiya et al. |

FOREIGN PATENT DOCUMENTS

| | | |
|---|---|---|
| JP | 2002-267530 A | 9/2002 |
| JP | 5300102 B2 | 9/2013 |
| KR | 10-1498522 B1 | 3/2015 |

OTHER PUBLICATIONS

Nicholas Fieldhouse et al., "Electrical properties of vanadium oxide thin films for bolometer application: processed by pulse dc sputtering", Journal of Physics D: Applied Physics, 2009, pp. 1-6, vol. 42.

(Continued)

*Primary Examiner* — Edwin C Gunberg
(74) *Attorney, Agent, or Firm* — Rabin & Berdo, P.C.

(57) ABSTRACT

Disclosed is a resistor thin film for micro-bolometer for growth of a vanadium dioxide ($VO_2$) thin film in tetragonal $VO_2$ crystal phase by deposition of $VO_2$ on oxide with perovskite structure and a method for fabricating the same, and the resistor thin film for micro-bolometer according to the present disclosure includes a silicon substrate, an oxide thin film with perovskite structure formed on the silicon substrate, and a $VO_2$ thin film in tetragonal crystal phase formed on the oxide thin film with perovskite structure.

15 Claims, 6 Drawing Sheets

(51) Int. Cl.
*G01J 5/04* (2006.01)
*G01J 5/20* (2006.01)
*H01L 21/02* (2006.01)

(56) References Cited

OTHER PUBLICATIONS

R. T. Rajendra Kumar et al., "Pulsed laser deposited vanadium oxide thin films for uncooled infrared detectors", Sensors and Actuators A, 2003, pp. 62-67, Vo. 107.

THIN FILM STRUCTURE FOR MICRO-BOLOMETER AND METHOD FOR FABRICATING THE SAME

CROSS-REFERENCE TO RELATED APPLICATION

This application claims priority to Korean Patent Application No. 10-2017-0062411, filed on May 19, 2017, and all the benefits accruing therefrom under 35 U.S.C. § 119, the contents of which in its entirety are herein incorporated by reference.

BACKGROUND

1. Field

The present disclosure relates to a resistor thin film for micro-bolometer and a method for fabricating the same, and more particularly, to a resistor thin film for micro-bolometer for growth of a vanadium dioxide ($VO_2$) thin film in tetragonal $VO_2$ crystal phase by deposition of $VO_2$ on oxide with perovskite structure, and a method for fabricating the same.

2. Description of the Related Art

An infrared detector is classified into a photon detector and a thermal detector according to the detection principle. The photon detector includes a high performance quantum infrared sensor such as cryogenically cooled HgCdTe or mercury cadmium telluride (MCT) and InSb operating at the temperature of 80K, and is used for high-speed missile tracking and military night-vision sensors. The disadvantage of the photon detector is relatively high price.

The thermal detector includes a bolometer that detects resistance changes resulting from temperature changes of an object, a pyroelectric detector that detects changes in electrical polarity in response to temperature changes, and a thermoelectric detector that detects an electromotive force produced due to a temperature difference across two ends of a material.

Among them, a bolometer uses a resistor that converts a temperature change to an electrical signal. The resistor of the bolometer must have large changes in resistance as a result of minute changes in temperature, and at the same time, needs to be made of a material with low resistance to reduce bolometer noise, i.e., Johnson noise. For the resistor of the bolometer, vanadium oxide ($VO_x$) with relatively large temperature coefficient of resistance (TCR) and allowing a low temperature process is mainly used. $VO_x$ exhibits a large specific resistance change because of having a metal to insulator transition (MIT) at certain temperature.

$VO_x$ has various compositions such as $V_2O_3$, $V_2O_5$, $VO_2$ and the like. $V_2O_3$ has very low resistance at room temperature, but TCR is not high, so single phase $V_2O_3$ is difficult to be used in bolometer applications. $V_2O_5$ has a high TCR, but resistance is high, so single phase $V_2O_5$ is also difficult to be used in bolometer applications.

Meanwhile, vanadium dioxide ($VO_2$) is a polymorphic material that can assume various crystallographic structures in the same chemical structure. Typically, $VO_2$ with monoclinic crystal phase at room temperature has been reported so much. Monoclinic $VO_2$ has relatively low resistance and a high TCR, but a phase transition occurs at certain temperature, forming a hysteresis loop on the temperature-resistance graph with the increasing temperature. Due to this problem, a bolometer fabricated with monoclinic $VO_2$ crystal phase is only usable below the temperature (about 68° C.) at which a hysteresis loop is formed, which limits the operating temperature range.

$VO_2$ also exists in tetragonal crystal phase, and tetragonal $VO_2$ crystal phase does not have a phase transition in the range of room temperature to 100° C., and thus the bolometer operating temperature range is not limited.

However, referring to the phase diagram of $VO_x$, $VO_x$ has numerous intermediate phases, and $VO_2$ also sensitively reacts to oxygen partial pressure and deposition pressure in the deposition, resulting in transformation to monoclinic $VO_2$ crystal phase and tetragonal $VO_2$ crystal phase. Accordingly, it is difficult to grow a $VO_2$ thin film in tetragonal crystal phase with reproducibility.

SUMMARY

The present disclosure is designed to solve the problem such as the foregoing, and therefore the present disclosure is directed to providing a resistor thin film for micro-bolometer for growth of a vanadium dioxide ($VO_2$) thin film in tetragonal $VO_2$ crystal phase by deposition of $VO_2$ on oxide with perovskite structure, and a method for fabricating the same.

To achieve the above-described object, a resistor thin film for micro-bolometer according to the present disclosure includes a semiconductor substrate, an oxide thin film with perovskite structure formed on the semiconductor substrate, and a $VO_2$ thin film in tetragonal crystal phase formed on the oxide thin film with perovskite structure.

The semiconductor substrate may be one of a silicon substrate, a GaAs substrate and a sapphire substrate, and when the semiconductor substrate is a silicon substrate, a silicon oxide film may be provided on the silicon substrate and the oxide thin film with perovskite structure may be formed on the silicon oxide film.

Additionally, the $VO_2$ thin film in tetragonal crystal phase may be formed with a thickness of 40 to 100 nm, and the oxide thin film with perovskite structure may be formed with a thickness of 5 to 20 nm.

The oxide thin film with perovskite structure may be made of one of $CaTiO_3$, $LaAlO_3$, $BaTiO_3$, $SrTiO_3$, $SrRuO_3$ and $BiFeO_3$.

Additionally, the tetragonal $VO_2$ crystal phase may have a temperature coefficient of resistance (TCR) absolute value of 3%/K or more and a specific resistance value of 1 Ωcm or less.

A method for fabricating a resistor thin film for micro-bolometer according to the present disclosure includes preparing a semiconductor substrate, stacking an oxide thin film with perovskite structure on the semiconductor substrate, and forming a $VO_2$ thin film in tetragonal crystal phase on the oxide thin film with perovskite structure.

In the forming of a $VO_2$ thin film in tetragonal crystal phase on the oxide thin film with perovskite structure, during deposition of $VO_2$, tetragonal $VO_2$ crystal phase similar to a lattice structure of the oxide with perovskite structure may have a preferred orientation among various crystal phases of $VO_2$.

The forming of a $VO_2$ thin film in tetragonal crystal phase on the oxide thin film with perovskite structure may use a sputtering process in which a sputtering target is vanadium dioxide ($VO_x$) in monoclinic crystal phase, a process pressure is set to 5 to 20 mTorr, a process temperature is set to 200 to 500° C., and mixed gas of $O_2$ and Ar is supplied into a sputtering chamber at a ratio of $O_2/(Ar+O_2)=0.2$ to 0.3%.

The forming of a VO$_2$ thin film in tetragonal crystal phase on the oxide thin film with perovskite structure may use a reactive sputtering process in which a sputtering target is vanadium metal and reactive gas including O$_2$ is supplied into a chamber.

The resistor thin film for micro-bolometer and the method for fabricating the same according to the present disclosure have effects such as below.

It is possible to stably grow the tetragonal VO$_2$ crystal phase having low resistance itself and a high TCR with reproducibility and thus fabricate micro-bolometers with superior properties.

DETAILED DESCRIPTION

The present disclosure presents technology about a resistor thin film of a micro-bolometer that changes temperature changes to resistance changes.

As mentioned in the description of the related art, a resistor thin film of a micro-bolometer needs to have low resistance itself as well as a high temperature coefficient of resistance (TCR). The tetragonal VO$_2$ crystal phase has a TCR absolute value of 3%/K or more and a specific resistance value of 1 Ωcm or less, satisfying the requirements as a resistor thin film of a micro-bolometer, but is sensitive to deposition conditions, and thus is difficult to grow in homogeneous phase.

The present disclosure presents technology to stably grow a vanadium dioxide (VO$_2$) thin film in tetragonal VO$_2$ crystal phase by deposition of VO$_2$ on an oxide thin film with perovskite structure.

The oxide with perovskite structure and the tetragonal VO$_2$ crystal phase have similar lattice structures, and thus, in the deposition of VO$_2$ on the oxide thin film with perovskite structure, tetragonal VO$_2$ crystal phase has a preferred orientation among various crystal phases of VO$_2$. As above, the tetragonal VO$_2$ crystal phase with a preferred orientation is grown on the oxide thin film with perovskite structure, thereby stably growing a tetragonal VO$_2$ thin film in homogeneous phase.

Hereinafter, a resistor thin film for micro-bolometer and a method for fabricating the same according to an embodiment of the present disclosure will be described in detail with reference to the accompanying drawings. First, a method for fabricating a resistor thin film for micro-bolometer according to an embodiment of the present disclosure will be described.

Figure 1:
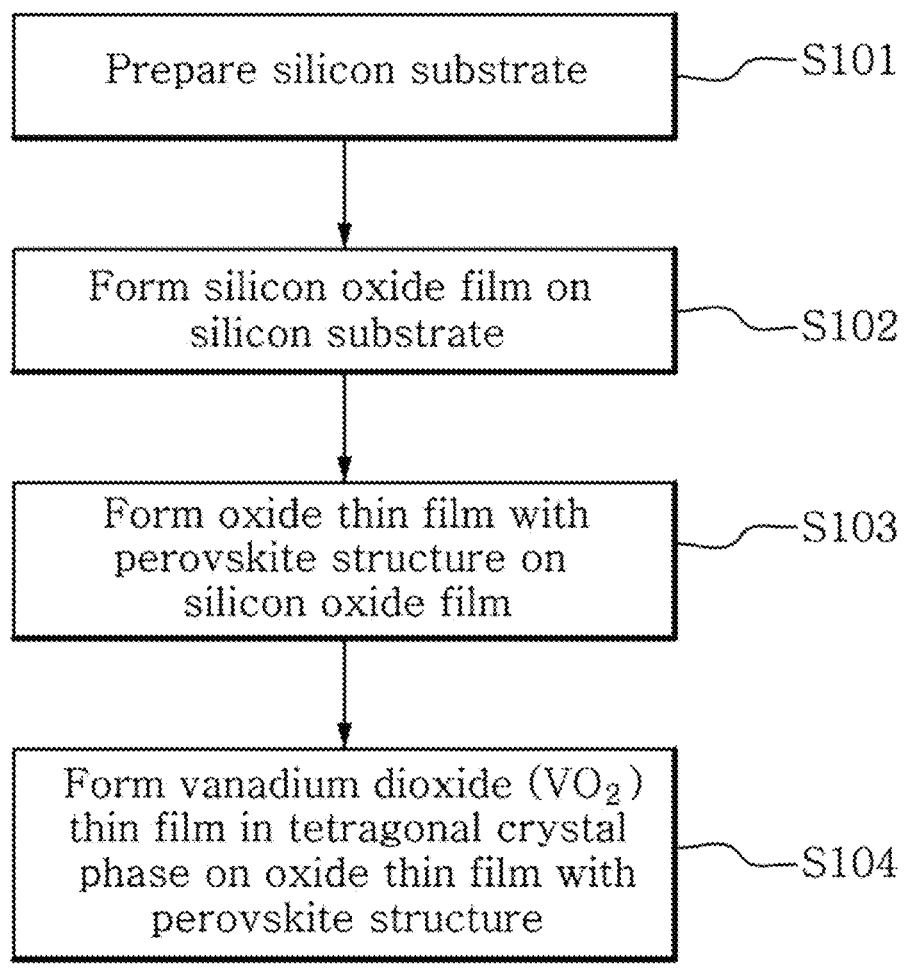
FIG. 1 is a flowchart illustrating a method for fabricating a resistor thin film for micro-bolometer according to an embodiment of the present disclosure.
Figure 2:
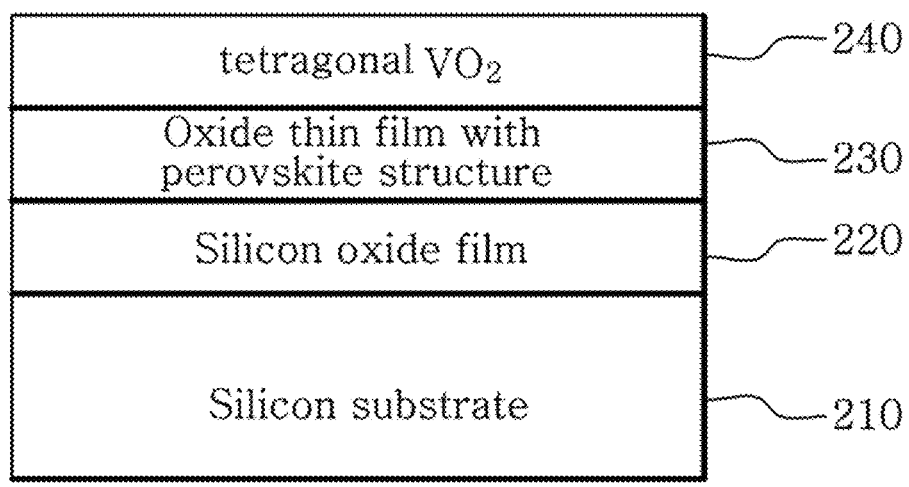
FIG. 2 is a configuration diagram of a resistor thin film for micro-bolometer according to an embodiment of the present disclosure.

Referring to FIGS. 1 and 2, a substrate 210 is prepared (S101), and an insulation film 220 is formed on the substrate 210 at the thickness of about 100 nm (S102). For the substrate 210, a semiconductor substrate such as a silicon substrate may be used, and besides a silicon substrate, a GaAs substrate and a sapphire substrate may be also used. When a silicon substrate is used, the insulation film 220 may include a silicon oxide film (SiO$_x$).

Subsequently, an oxide thin film 230 with perovskite structure is stacked on the insulation film 220, for example, the silicon oxide film 220 (S103). The perovskite structure oxide thin film 230 has a function of selecting the crystal structure of vanadium oxide as a buffer layer. Only the VO$_2$ phase is selectively formed among various phases of the vanadium oxide to greatly improve the TCR and decrease the resistivity.

The oxide thin film 230 with perovskite structure may be made of one of CaTiO$_3$, LaAlO$_3$, BaTiO$_3$, SrTiO$_3$, SrRuO$_3$ and BiFeO$_3$, and may be formed through a physical vapor deposition or plasma-enhanced chemical vapor deposition (PECVD) method such as sputtering, pulsed laser deposition (PLD), and e-beam evaporation. The oxide thin film 230 with perovskite structure is preferably formed with the thickness of 5-20 nm.

The deposition process of the oxide thin film 230 having the perovskite structure can be performed at a temperature range of 25 to 700° C. Since the performance of the bolometer is hardly changed within this range, growth at room temperature is also possible.

In a state that the oxide thin film 230 with perovskite structure is formed, a vanadium dioxide (VO$_x$) thin film 240 in tetragonal crystal phase is formed on the oxide thin film 230 with perovskite structure at the thickness of 40-100 nm using a sputtering method (S104). In the sputtering process, a sputtering target is vanadium dioxide (VO$_x$) in monoclinic crystal phase, the process pressure is set to 5-20 mTorr, the process temperature is set to 200-500° C., and mixed gas of O$_2$ and Ar is supplied into a sputtering chamber at a ratio of O$_2$/(Ar+O$_2$)=0.2-0.3%.

The deposition temperature of the material is an important factor in the fabrication of the bolometer. If the deposition temperature is high, it damages the ROIC substrate, so that even if the material performance is good, the bolometer may become useless. In the present invention, the deposition process can be performed at a relatively low temperature of 200 to 500° C., which is highly scalable.

Figure 3:
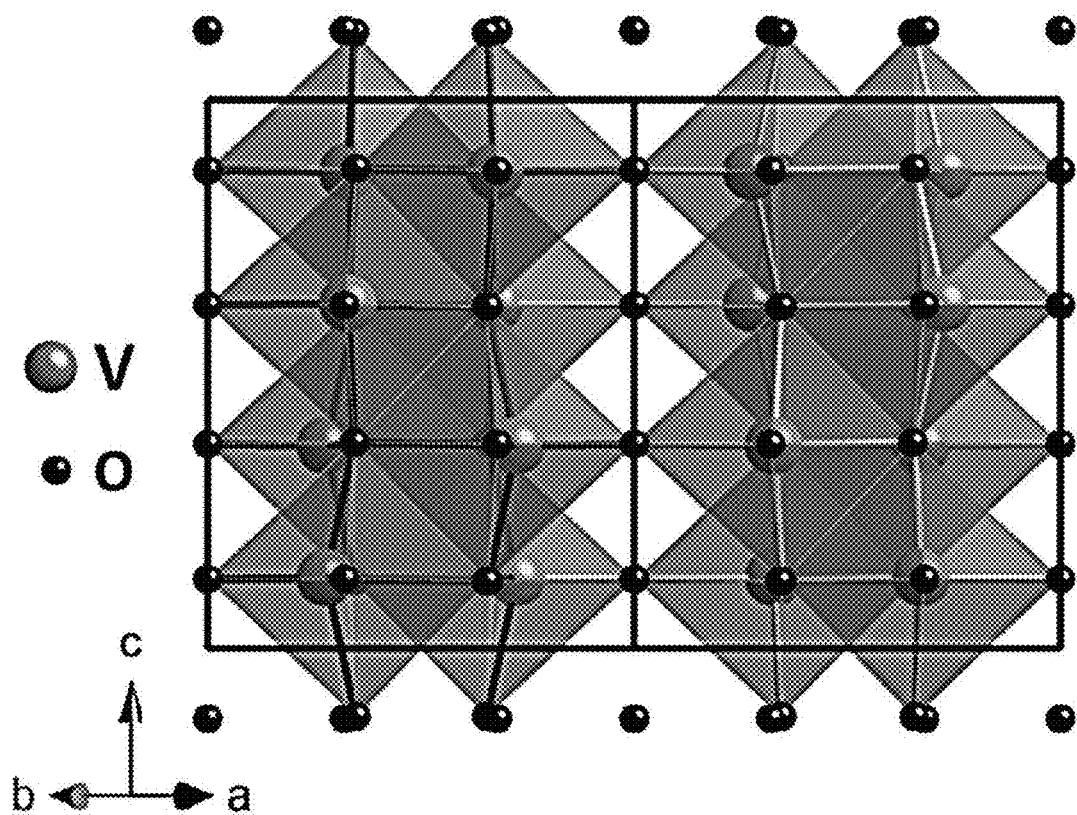
FIG. 3 is a reference diagram showing a lattice structure of tetragonal VO$_2$ crystal phase.

In the course of the sputtering process, because the lattice structure of the oxide with perovskite structure and the lattice structure of the tetragonal VO$_2$ crystal phase are similar to each other, among various crystal phases of VO$_2$, tetragonal VO$_2$ crystal phase with a preferred orientation is grown on the oxide thin film 230 with perovskite structure. Through this, the vanadium dioxide (VO$_x$) thin film 240 in homogeneous tetragonal crystal phase may be formed on the oxide thin film 230 with perovskite structure. For reference, the lattice structure of the tetragonal VO$_2$ crystal phase is as shown in FIG. 3.

Additionally, a vanadium dioxide (VO$_x$) thin film in tetragonal crystal phase may be also formed through a reactive sputtering process. In this case, a sputtering target is a vanadium (V) metal target, O$_2$ is supplied into the chamber, inducing the bond of sputtered vanadium ion (V$^+$) and oxygen ion (O$^{2-}$) to form a vanadium dioxide (VO$_x$) thin film in tetragonal crystal phase.

Besides the sputtering process and the reactive sputtering process described above, the vanadium dioxide (VO$_x$) thin film 240 in homogeneous tetragonal crystal phase may be also formed on the oxide thin film 230 with perovskite structure through a pulsed laser deposition process.

Through the foregoing process, the fabrication of the resistor thin film for micro-bolometer according to an embodiment of the present disclosure is finished, and the fabricated resistor thin film for micro-bolometer has a stack structure such as shown in FIG. 2.

Hereinafter, the present disclosure will be described in more detail through experimental examples.

Experimental Example 1: Fabrication of Tetragonal VO$_2$/SrTiO$_3$ Thin Film

A VO$_2$ thin film in tetragonal crystal phase was formed on a SrTiO$_3$ thin film at the thickness of 54 nm through a sputtering process. A sputtering target was VO$_2$ in monoclinic crystal phase, and the process pressure was set to 5-20 mTorr, the process temperature was set to 200-500° C., and mixed gas of O$_2$ and Ar was supplied into a sputtering chamber at a ratio of O$_2$/(Ar+O$_2$)=0.2-0.3%.

Figure 4A:
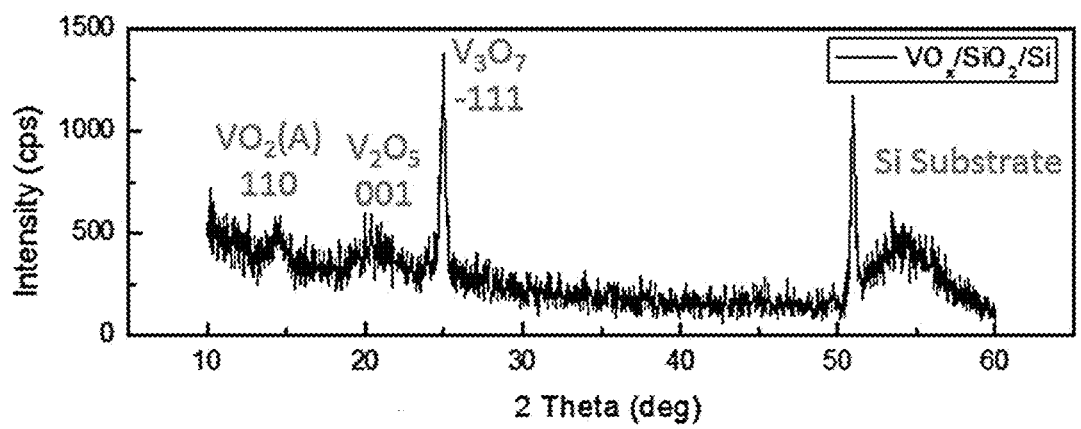
FIGS. 4A and 4B show X-ray diffraction analysis results of a tetragonal VO$_2$/SrTiO$_3$ thin film fabricated through experimental example 1.
Figure 4B:
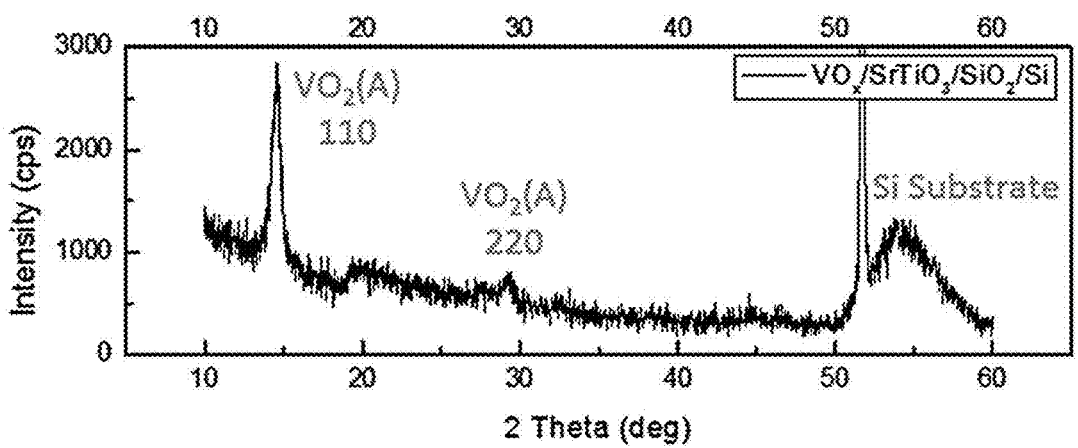

As a result of conducting X-ray diffraction analysis of the tetragonal VO$_2$/SrTiO$_3$ thin film fabricated through experimental example 1, it can be seen that peak for tetragonal VO$_2$ crystal phase ('VO$_2$(A)' in FIG. 4B) appears as shown in FIG. 4B, and this confirms that VO$_2$ grown on the SrTiO$_3$ thin film is tetragonal VO$_2$ crystal phase. On the contrary, when an oxide thin film with perovskite structure is not used, it can be seen that various crystal phases of vanadium dioxide such as VO$_2$(A), V$_2$O$_5$ and V$_3$O$_7$ exist together as shown in of FIG. 4A.

Figure 5:
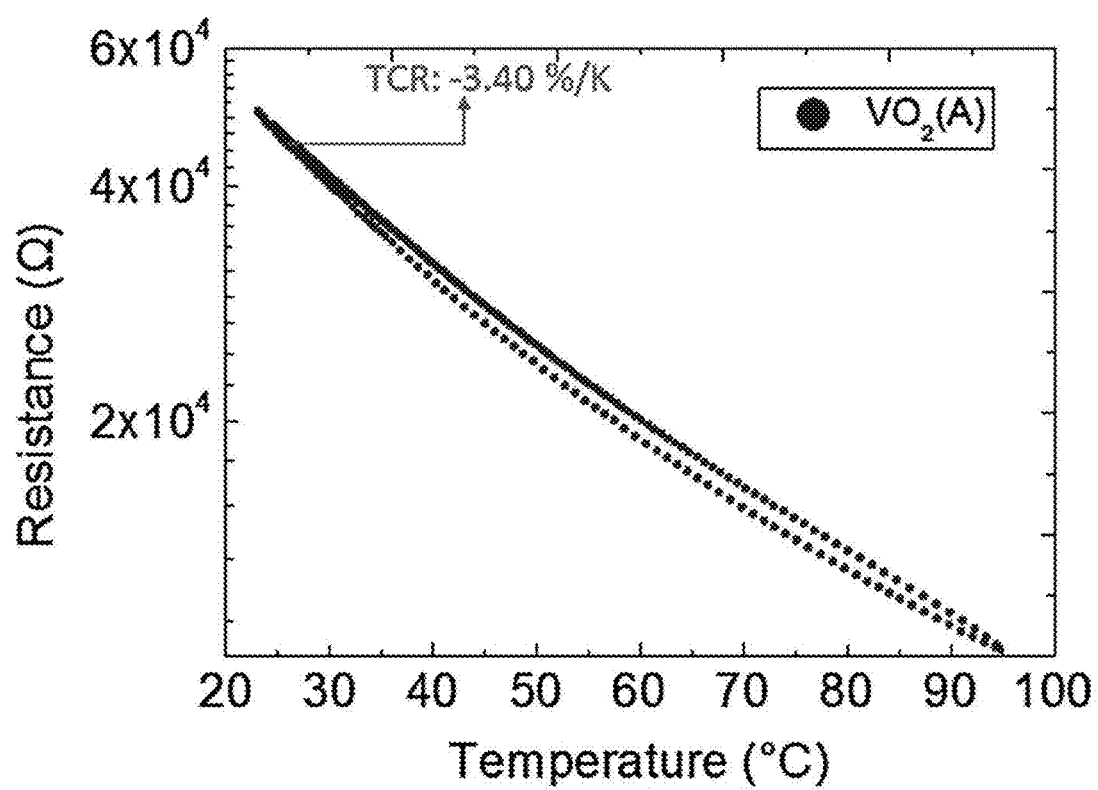
FIG. 5 is a graph showing resistance changes in response to temperature changes of a vanadium dioxide (VO$_x$) thin film in tetragonal crystal phase fabricated through experimental example 1.

Experimental Example 2: Characteristics of Resistance Change in Response to Temperature Change FIG. 5 is a graph showing resistance changes in response to temperature changes of the vanadium dioxide (VO$_x$) thin film in tetragonal crystal phase fabricated through experimental example 1. Referring to FIG. 5, the resistance at room temperature was 44 kΩ, the specific resistance was 0.2 Ωcm or less, and TCR at room temperature was −3.6%/K. Additionally, it can be seen that no hysteresis loop is found in the process of cooling after increasing the temperature of the thin film. This result suggests that the operating temperature range may be extended when a micro-bolometer is fabricated using the vanadium dioxide (VO$_x$) thin film in tetragonal crystal phase.

Figure 6:
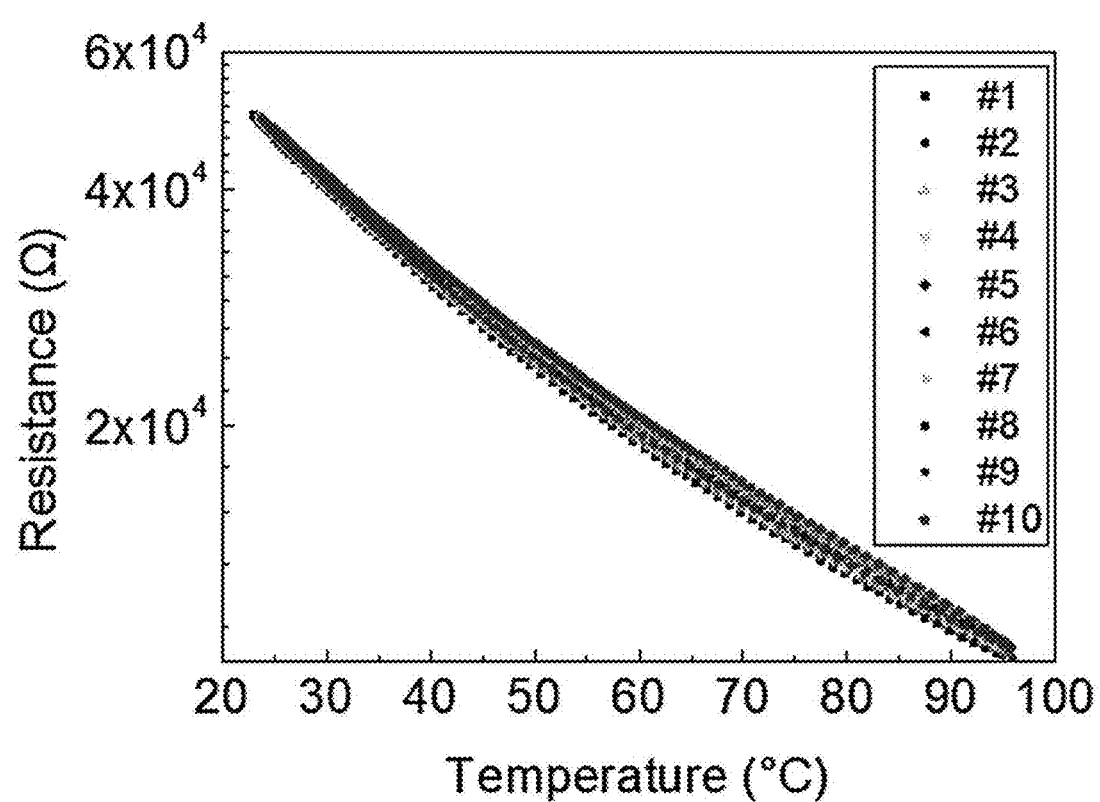
FIG. 6 is a graph showing resistance changes in response to temperature changes in ten times repeated experiments for a vanadium dioxide (VO$_x$) thin film in tetragonal crystal phase fabricated through experimental example 1.

Additionally, to identify suitability as bolometer devices, the process of cooling after increasing the temperature of the thin film was performed iteratively 10 times, resistance changes with the temperature change were measured each time (see FIG. 6), and it was found that there was no change in performance.

What is claimed is:

1. A resistor thin film for micro-bolometer, comprising:
   a semiconductor substrate;
   an oxide thin film with perovskite structure formed on the semiconductor substrate; and
   a vanadium dioxide (VO$_2$) thin film in tetragonal crystal phase formed on the oxide thin film with perovskite structure.

2. The resistor thin film for micro-bolometer according to claim 1, wherein the semiconductor substrate is one of a silicon substrate, a GaAs substrate, and a sapphire substrate, and
   when the semiconductor substrate is a silicon substrate, a silicon oxide film is provided on the silicon substrate, and the oxide thin film with perovskite structure is formed on the silicon oxide film.

3. The resistor thin film for micro-bolometer according to claim 1, wherein the vanadium dioxide (VO$_2$) thin film in tetragonal crystal phase is formed with a thickness of 40 to 100 nm.

4. The resistor thin film for micro-bolometer according to claim 1, wherein the oxide thin film with perovskite structure is formed with a thickness of 5 to 20 nm.

5. The resistor thin film for micro-bolometer according to claim 1, wherein the oxide thin film with perovskite structure is made of one of CaTiO$_3$, LaAlO$_3$, BaTiO$_3$, SrTiO$_3$, SrRuO$_3$ and BiFeO$_3$.

6. The resistor thin film for micro-bolometer according to claim 1, wherein the vanadium dioxide (VO$_2$) thin film in tetragonal crystal phase has a temperature coefficient of resistance (TCR) absolute value of 3%/K or more and a specific resistance value of 1 Ωcm or less.

7. A method for fabricating a resistor thin film for micro-bolometer, comprising:
   preparing a semiconductor substrate;
   stacking an oxide thin film with perovskite structure on the semiconductor substrate; and
   forming a vanadium dioxide (VO$_2$) thin film in tetragonal crystal phase on the oxide thin film with perovskite structure.

8. The method for fabricating a resistor thin film for micro-bolometer according to claim 7, wherein in the forming of a vanadium dioxide (VO$_2$) thin film in tetragonal crystal phase on the oxide thin film with perovskite structure,
   during deposition of vanadium dioxide (VO$_2$), tetragonal VO$_2$ crystal phase similar to a lattice structure of the oxide with perovskite structure has a preferred orientation among various crystal phases of vanadium dioxide (VO$_2$).

9. The method for fabricating a resistor thin film for micro-bolometer according to claim 7, wherein the forming of a vanadium dioxide (VO$_2$) thin film in tetragonal crystal phase on the oxide thin film with perovskite structure uses a sputtering process in which a sputtering target is vanadium dioxide (VO$_x$) in monoclinic crystal phase, a process pressure is set to 5 to 20 mTorr, a process temperature is set to 200 to 500° C., and mixed gas of O$_2$ and Ar is supplied into a sputtering chamber at a ratio of O$_2$/(Ar+O$_2$)=0.2 to 0.3%.

10. The method for fabricating a resistor thin film for micro-bolometer according to claim 7, wherein the forming of a vanadium dioxide (VO$_2$) thin film in tetragonal crystal phase on the oxide thin film with perovskite structure uses a reactive sputtering process in which a sputtering target is vanadium metal and reactive gas including O$_2$ is supplied into a chamber.

11. The method for fabricating a resistor thin film for micro-bolometer according to claim 7, wherein the oxide thin film with perovskite structure is made of one of CaTiO$_3$, LaAlO$_3$, BaTiO$_3$, SrTiO$_3$, SrRuO$_3$, and BiFeO$_3$.

12. The method for fabricating a resistor thin film for micro-bolometer according to claim 7, wherein the vanadium dioxide (VO$_2$) thin film in tetragonal crystal phase is formed with a thickness of 40 to 100 nm, and the oxide thin film with perovskite structure is formed with a thickness of 5 to 20 nm.

13. The method for fabricating a resistor thin film for micro-bolometer according to claim 7, wherein the vanadium dioxide ($VO_2$) thin film in tetragonal crystal phase has a temperature coefficient of resistance (TCR) absolute value of 3%/K or more and a specific resistance value of 11 Ωcm or less.

14. The method for fabricating a resistor thin film for micro-bolometer according to claim 7, wherein the semiconductor substrate is one of a silicon substrate, a GaAs substrate and a sapphire substrate, and
  when the semiconductor substrate is a silicon substrate, a silicon oxide film is provided on the silicon substrate, and the oxide thin film with perovskite structure is formed on the silicon oxide film.

15. The method for fabricating a resistor thin film for micro-bolometer according to claim 7, wherein the stacking an oxide thin film with perovskite structure on the semiconductor substrate is performed at room temperature.

\* \* \* \* \*